(12) United States Patent
Hummler

(10) Patent No.: US 7,440,309 B2
(45) Date of Patent: Oct. 21, 2008

(54) MEMORY HAVING PARITY ERROR CORRECTION

(75) Inventor: Klaus Hummler, Apex, NC (US)

(73) Assignee: Infineon Technologies AG, Munich (DE)

( * ) Notice: Subject to any disclaimer, the term of this patent is extended or adjusted under 35 U.S.C. 154(b) by 172 days.

(21) Appl. No.: 11/153,795

(22) Filed: Jun. 15, 2005

(65) Prior Publication Data

US 2006/0285410 A1    Dec. 21, 2006

(51) Int. Cl.
*G11C 11/02* (2006.01)

(52) U.S. Cl. .............. 365/149; 365/189.04; 365/200; 365/202

(58) Field of Classification Search .............. 365/200, 365/149, 150, 189.04, 202
See application file for complete search history.

(56) References Cited

U.S. PATENT DOCUMENTS

| | | | | |
|---|---|---|---|---|
| 5,289,421 A | * | 2/1994 | Lee et al. .................. 365/206 |
| 5,963,489 A | * | 10/1999 | Kirihata et al. ............. 365/200 |
| 6,838,331 B2 | | 1/2005 | Klein |
| 2003/0149929 A1 | | 8/2003 | White |
| 2004/0117723 A1 | | 6/2004 | Foss |
| 2004/0221098 A1 | | 11/2004 | Ito et al. |
| 2005/0201141 A1 | * | 9/2005 | Turner ....................... 365/149 |

* cited by examiner

*Primary Examiner*—Pho M. Luu
(74) *Attorney, Agent, or Firm*—Dicke, Billig & Czaja, PLLC

(57) ABSTRACT

A memory includes a sense amplifier segment and a plurality of word lines including a spare word line, a first transfer word line, and a second transfer word line complementary to the first transfer word line. The memory includes a plurality of bit lines coupled to the sense amplifier segment and a memory cell located at each cross point of each word line and each bit line. The first transfer word line and the second transfer word line are adapted for simultaneously inverting data bit values stored in memory cells along a failed word line to correct a parity error during self refresh.

21 Claims, 6 Drawing Sheets

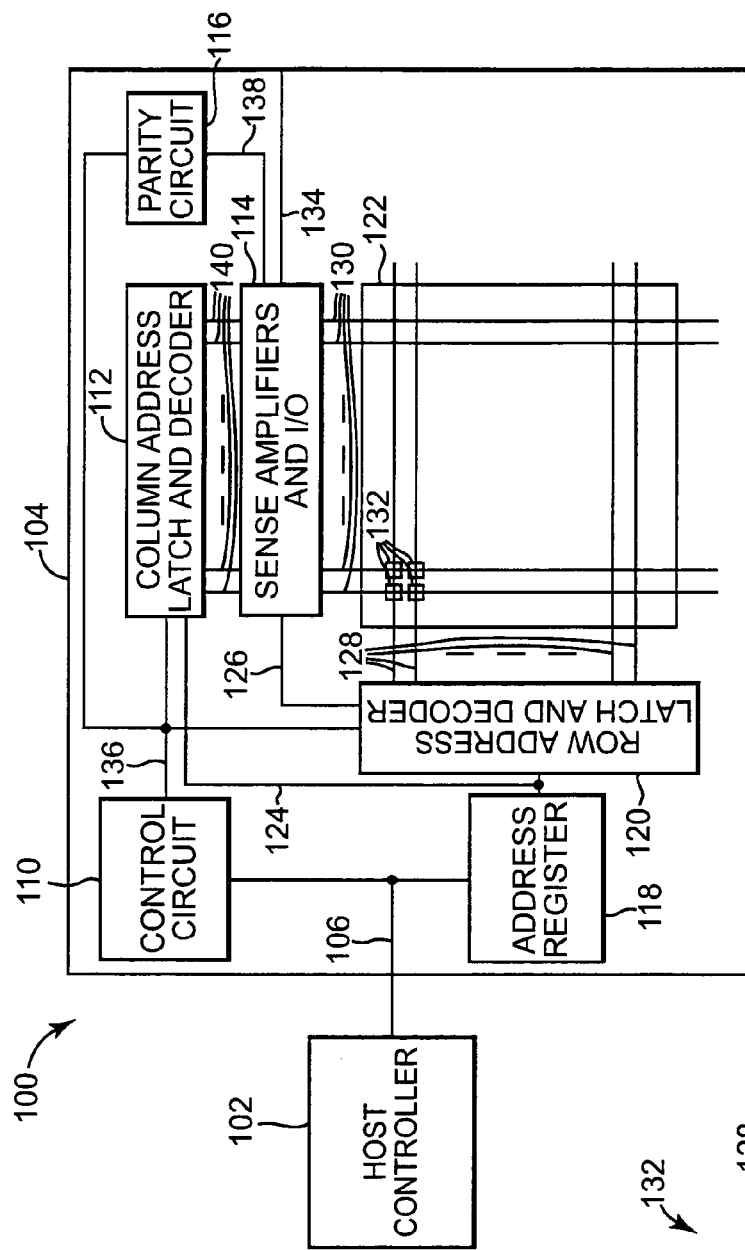
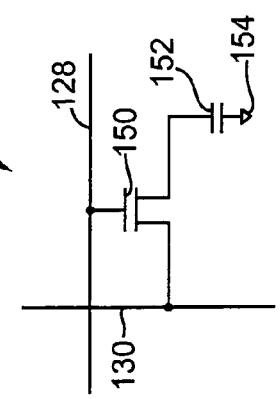
Fig. 1
Fig. 2

MEMORY HAVING PARITY ERROR CORRECTION

CROSS-REFERENCE TO RELATED APPLICATIONS

This application is related to U.S. patent application Ser. No. 11/153,187, entitled "MEMORY HAVING PARITY GENERATION CIRCUIT;" filed Jun. 15, 2005, and is incorporated herein by reference.

BACKGROUND

Memory speed and memory capacity continue to increase to meet the demands of system applications. Some of these system applications include mobile electronic systems that have limited space and limited power resources. In mobile applications, such as cellular telephones and personal digital assistants (PDAs), memory cell density and power consumption are issues for future generations. To address these issues, the industry is developing random access memories (RAMs) for mobile applications having low power consumption and including error correction.

Error correction code (ECC) calculates parity information and can determine if a bit has switched to an incorrect value. ECC can compare the parity originally calculated to the tested parity and make any corrections to correct for incorrect data values. In some cases, it is desirable to have ECC built directly onto a memory chip to provide greater memory chip reliability or to optimize other memory chip properties such as self refresh currents on low power dynamic RAMs (DRAMs). ECC circuitry, however, is typically associated with a large overhead due to additional memory elements used to store the parity information and additional logic circuitry used to calculate the parity information and error correction results. Typical ECC implementations may cost up to 50% of the memory chip area.

SUMMARY

One embodiment of the present invention provides a memory. The memory includes a sense amplifier segment and a plurality of word lines including a spare word line, a first transfer word line, and a second transfer word line complementary to the first transfer word line. The memory includes a plurality of bit lines coupled to the sense amplifier segment and a memory cell located at each cross point of each word line and each bit line. The first transfer word line and the second transfer word line are adapted for simultaneously inverting data bit values stored in memory cells along a failed word line to correct a parity error during self refresh.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

FIG. 1 is a block diagram illustrating one embodiment of an electronic system, according to the present invention.

FIG. 2 is a diagram illustrating one embodiment of a memory cell in an array of memory cells.

DETAILED DESCRIPTION

Figure 3:
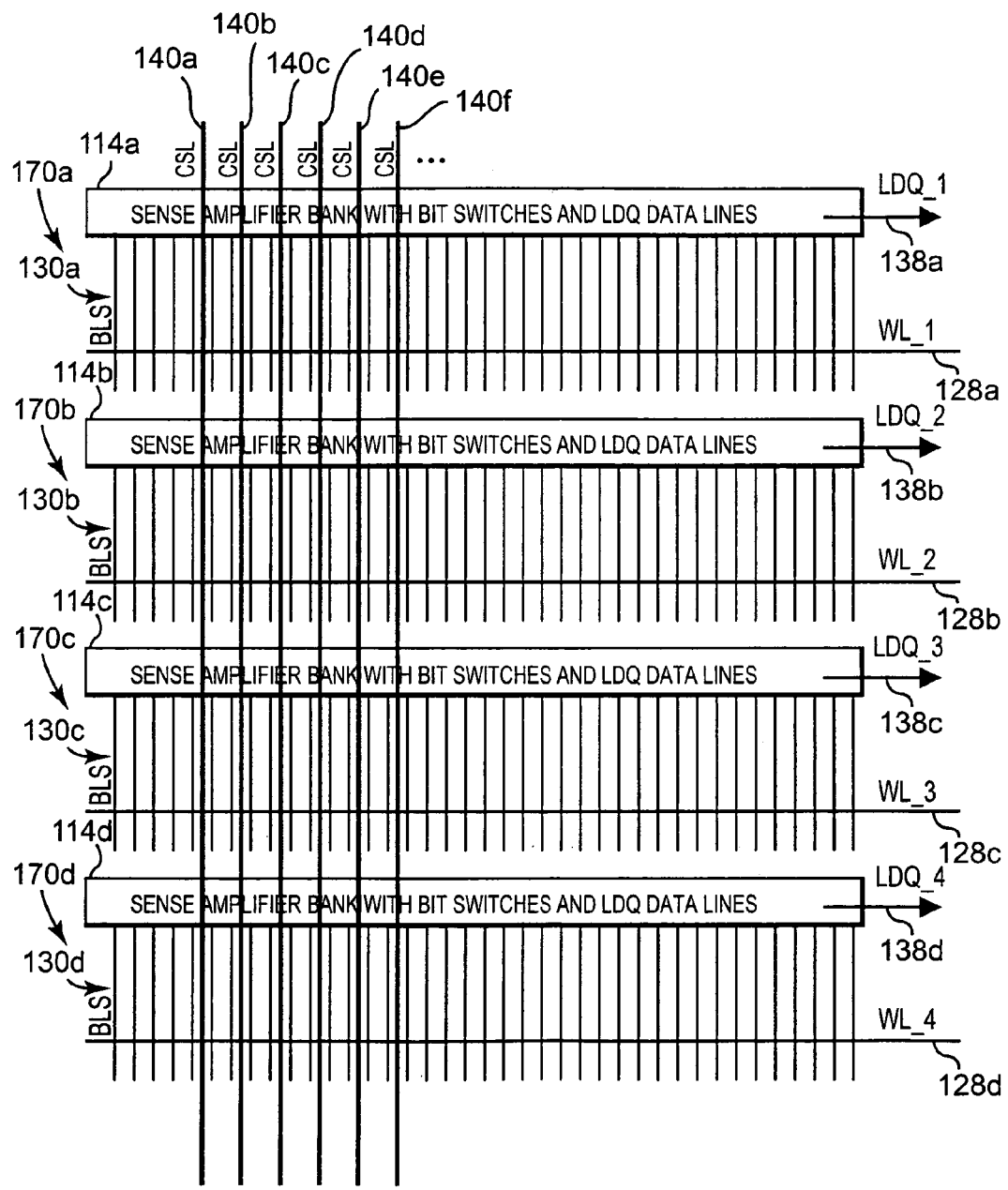
FIG. 3 is a block diagram illustrating one embodiment of column segments of a random access memory.

FIG. 1 is a block diagram illustrating one embodiment of an electronic system 100, according to the present invention. Electronic system 100 includes a host controller 102 and a dynamic random access memory (DRAM) 104. DRAM 104 includes a parity circuit 116 for performing error detection using a parity bit approach during the self refresh (SRF) operation of DRAM 104. Self refresh enables DRAM 104 to refresh independent of external refresh circuitry to maintain user data in DRAM 104. DRAM 104 is configured to attempt an error correction if a parity error is detected by parity circuit 116. A detected error is corrected without determining the failing memory cell that caused the error. In one embodiment, the error detection and correction circuitry occupies less than approximately five percent of the memory chip area.

Host controller 102 is electrically coupled to DRAM 104 through memory communications path 106. Host controller 102 provides row and column addresses and control signals to DRAM 104 through memory communications path 106. In one embodiment, host controller 102 provides control signals including read/write enable, row address strobe (RAS), and column address strobe (CAS) signals. In one embodiment, DRAM 104 is a pseudo static random access memory (PSRAM) and host controller 102 provides control signals including static RAM (SRAM) control signals. Embodiments of the invention apply to DRAMs is general, including low power memory devices.

DRAM 104 includes an array of memory cells 122, a row address latch and decoder 120, a column address latch and decoder 112, a sense amplifier and input/output (I/O) circuit 114, a control circuit 110, an address register 118, and a parity circuit 116. Conductive word lines 128, referred to as row select lines, extend in the x-direction across the array of memory cells 122. Conductive bit lines 130, referred to as bit lines, extend in the y-direction across the array of memory cells 122. A memory cell 132 is located at each cross point of a word line 128 and a bit line 130 pair.

Each word line 128 is electrically coupled to row address latch and decoder 120, and each bit line 130 is electrically coupled to one of the sense amplifiers in sense amplifier and I/O circuit 114. Sense amplifier and I/O circuit 114 is electrically coupled to column address latch and decoder 112 through conductive column select lines 140. Also, sense amplifier and I/O circuit 114 is electrically coupled to row address latch and decoder 120 through communication lines 126 and to data I/O pads or pins, referred to as DQs, through I/O communications path 134. Data is transferred between sense amplifier and I/O circuit 114 in DRAM 104 and an external device, such as host controller 102, through I/O communications path 134. Sense amplifier and I/O circuit 114 is also coupled to parity circuit 116 through local data lines 138.

Host controller 102 is electrically coupled to control circuit 110 and address register 118 through memory communications path 106. Control circuit 110 is electrically coupled to row address latch and decoder 120, column address latch and decoder 112, and parity circuit 116 through control communications path 136. Address register 118 is electrically coupled to row address latch and decoder 120 and column address latch and decoder 112 through row and column address lines 124.

Control circuit 110 receives addresses and control signals from host controller 102 through memory communications path 106. In one embodiment, host controller 102 provides control signals including read/write enable, RAS, and CAS signals to control circuit 110. In one embodiment, DRAM 104 is a PSRAM and host controller 102 provides control signals including SRAM control signals to control circuit 110 that provides the DRAM control signals, such as read/write enable, RAS, and CAS signals. Control circuit 110 also provides signals to parity circuit 116 for generating parity information and checking for parity errors during self refresh of DRAM 104. Control circuit 110 receives parity mismatch signals from parity circuit 116 for initiating error correction for failing word lines.

Address register 118 receives row and column addresses from host controller 102 through memory communications path 106. Address register 118 supplies a row address to row address latch and decoder 120 through row and column address lines 124. Control circuit 110 supplies a RAS signal to row address latch and decoder 120 through control communications path 136 to latch the supplied row address into row address latch and decoder 120. Address register 118 supplies a column address to column address latch and decoder 112 through row and column address lines 124. Control circuit 110 supplies a CAS signal to column address latch and decoder 120 through control communications path 136 to latch the supplied column address into column address latch and decoder 112.

Row address latch and decoder 120 receives the row addresses and RAS signals and latches the row addresses into row address latch and decoder 120. Also, row address latch and decoder 120 decodes each of the row addresses to select a row of memory cells 132. In addition, row address latch and decoder 120 provides sense amplifier activation signals and equalization and precharge signals to sense amplifier and I/O circuit 114 through communications path 126.

Column address latch and decoder 112 activates column select lines 140 to connect sense amplifiers to I/O circuits in sense amplifier and I/O circuit 114. Column address latch and decoder 112 receives a column address and latches the column address into column address latch and decoder 112. Also, column address latch and decoder 112 decodes the column address to select addressed column select lines 140. In addition, column address latch and decoder 112 receives column select line activation signals from control circuit 110 through control communications path 136. The column select line activation signals indicate which of the addressed column select lines 140 are to be activated by column address latch and decoder 112. Column address latch and decoder 112 activates column select lines 140 that are addressed by the column address and selected for activation by the column select line activation signals. Activated column select lines 140 are provided to sense amplifier and I/O circuit 114 to connect sense amplifiers to I/O circuits.

Column select lines 140 are grouped into column segments. Each column segment includes a group of column select lines 140 that correspond to a set of sense amplifiers and I/O circuits. Multiple column select lines 140 in a column segment can share one I/O circuit in the set of I/O circuits, alternatively connecting a sense amplifier to the shared I/O circuit. Column select lines 140 in an adjacent column segment connect sense amplifiers to a different corresponding set of I/O circuits.

Sense amplifier and I/O circuit 114 includes sense amplifiers, equalization and precharge circuits, data input buffers, and data output buffers. The sense amplifiers are differential input sense amplifiers and each sense amplifier receives one bit line at each of the two differential inputs. One of the bit lines receives a data bit from a selected memory cell and the other bit line is used as a reference. The equalization and precharge circuits equalize the voltage on bit lines connected to the same sense amplifier prior to a read or write operation.

To read a data bit, a sense amplifier amplifies the difference between the data bit value and the reference value and provides a sensed output value to one of the data output buffers. The data output buffer receives the sensed data bit value and supplies the data bit to one or more external devices, such as host controller 102, through I/O communications path 134. To write a data bit, a data input buffer receives and transfers the data bit from an external device to a sense amplifier in sense amplifier and I/O circuit 114 through I/O communications path 134. Data input buffer drivers overdrive the sense amplifier, wherein one input driver overdrives the data bit value onto the bit line that is connected to a selected memory cell and another input driver overdrives the inverse of the data bit value onto the reference bit line. The sense amplifier writes the received data bit value into the selected memory cell 132.

During a read operation, control circuit 110 receives read control signals and address register 118 receives the row address of a selected memory cell or cells 132. The row address is supplied from address register 118 to row address latch and decoder 120 and latched into row address latch and decoder 120 by control circuit 110 and a RAS signal. Row address latch and decoder 120 decodes the row address and activates the selected word line 128. As the selected word line 128 is activated, the value stored in each memory cell 132 coupled to the selected word line 128 is passed to the respective bit line 130. The bit value stored at a memory cell 132 is detected by a sense amplifier that is electrically coupled to the respective bit line 130.

Next, control circuit 110 and address register 118 receive the column address of the selected memory cell or cells 132. The column address is supplied from address register 118 to column address latch and decoder 112 and latched into column address latch and decoder 112 by control circuit 110 and a CAS signal. The column address latch and decoder 112 decodes the column address to select column select lines 140. The column select lines are activated to connect selected sense amplifiers to I/O circuits that pass data to an external device through I/O communications path 134.

During a write operation, data to be stored in the array of memory cells 122 is supplied from an external device to the DQ's and data input buffers through I/O communications path 134. Control circuit 110 receives write control signals and address register 118 receives the row address of a selected memory cell or cells 132. The row address is supplied from address register 118 to row address latch and decoder 120 and latched into row address latch and decoder 120 by control circuit 110 and a RAS signal. The row address latch and decoder 120 decodes the row address and activates the selected word line 128. As the selected word line 128 is activated, the value stored in each memory cell 132 coupled to the selected word line 128 is passed to the respective bit line 130 and the sense amplifier that is electrically coupled to the respective bit line 130.

Next, control circuit 110 and address register 118 receive the column address of the selected memory cell or cells 132.

Address register 118 supplies the column address to column address latch and decoder 112 and the column address is latched into column address latch and decoder 112 by control circuit 110 and a CAS signal.

Column address latch and decoder 112 receives column select line activation signals from control circuit 112 and activates selected column select lines to connect input buffers to sense amplifiers. The input buffers pass data from an external device to the sense amplifiers through I/O communications path 134. Also, the input buffers overdrive the sense amplifiers to write data to the selected memory cell or cells 132 through bit lines 130.

During self refresh of DRAM 104, parity circuit 116 calculates parity information for the entire memory array 122 and periodically compares the parity information of memory array 122 with the initially calculated parity information to detect failing memory cells 132. When a word line 128 is activated during a refresh operation during self refresh, the information in the memory cells 132 is sensed by sense amplifiers 114. Sense amplifiers 114 simultaneously sense the values stored in all memory cells 132 along the activated word line 128.

For a normal read/write operation, one column select line 140 is activated to pass the data bit value of one memory cell 132 onto a local data line (LDQ for passing the data bit value to an I/O circuit. During self refresh, LDQs 138 are coupled to parity circuit 116, and column select lines 140 are used to serially pass memory cell 132 data bit values for the activated word line to parity circuit 116 through LDQs 138. The data bit values are passed to parity circuit 116 by performing a burst activation through all column select lines 140 (excluding a parity column select line) along the activated word line for the column segment. The burst activation through column select lines 140 results in a string of logic high and logic low data signals indicating the data bit values stored in memory cells 132 along the activated word line.

The string of data bit values is received by parity circuit 116 to determine the parity of the data bit values stored in memory cells 132 along the activated word line. In one embodiment, the parity of the data bit values for the activated word line is stored in memory array 122 in a memory cell 132 on the end of the activated word line. During self refresh, after the initial (correct) parity information for memory array 122 is determined and stored, the parity of the data bit values stored in memory cells 132 along each word line is periodically determined and compared to the stored parity information. If the stored parity does not match the current parity, an attempt is made to correct the failing memory cell data.

FIG. 2 is a diagram illustrating one embodiment of a memory cell 132 in the array of memory cells 122. Memory cell 132 includes a transistor 150 and a capacitor 152. The gate of transistor 150 is electrically coupled to a word line 128. One side of the drain-source path of transistor 150 is electrically coupled to a bit line 130 and the other side of the drain-source path is electrically coupled to one side of capacitor 152. The other side of capacitor 152 is electrically coupled to a reference 154, such as one-half the supply voltage or ground. Capacitor 152 is charged and discharged to represent a logic "0" or a logic "1".

During a read operation, word line 128 is activated to turn on transistor 150 and the data bit value stored on capacitor 152 is read by a sense amplifier through bit line 130. During a write operation, word line 128 is activated to turn on transistor 150 and access capacitor 152. The sense amplifier connected to bit line 130 is overdriven to write a data bit value on capacitor 152 through bit line 130 and transistor 150.

A read operation on memory cell 132 is a destructive read operation. After each read operation, capacitor 152 is recharged or discharged to the data bit value that was just read. In addition, even without read operations, the charge on capacitor 152 discharges over time. To retain a stored data bit value, memory cell 132 is refreshed periodically by reading and/or writing memory cell 132, such as during self refresh. All memory cells 132 in the array of memory cells 122 are periodically refreshed to maintain their values.

FIG. 3 is a block diagram illustrating one embodiment of column segments 170a-170d of DRAM 104. Column segment 170a includes sense amplifier bank or segment 114a including bit switches and LDQ one (LDQ_1) 138a. Sense amplifier bank 114a is electrically coupled to bit lines (BLs) 130a. Word line one (WL_1) and other word lines (not shown) extend across bit lines 130a. A memory cell 132 (not shown) is located at each cross point of a bit line 130a pair and WL_1 128a. Column segment 170b includes sense amplifier bank or segment 114b including bit switches and LDQ two (LDQ_2) 138b. Sense amplifier bank 114b is electrically coupled to bit lines 130b. Word line two (WL_2) and other word lines (not shown) extend across bit lines 130b. A memory cell 132 (not shown) is located at each cross point of a bit line 130b pair and WL_2 128b.

Column segment 170c includes sense amplifier bank or segment 114c including bit switches and LDQ three (LDQ_3) 138c. Sense amplifier bank 114c is electrically coupled to bit lines 130c. Word line three (WL_3) and other word lines (not shown) extend across bit lines 130c. A memory cell 132 (not shown) is located at each cross point of a bit line 130c pair and WL_3 128c. Column segment 170d includes sense amplifier bank or segment 114d including bit switches and LDQ four (LDQ_4) 138d. Sense amplifier bank 114d is electrically coupled to bit lines 130d. Word line four (WL_4) 128d and other word lines (not shown) extend across bit lines 130d. A memory cell 132 (not shown) is located at each cross point of a bit line 130d pair and WL_4 128d. Column select lines (CSLs) 140a-140f and other CSLs (not shown) are electrically coupled to sense amplifier banks 114a, 114b, 114c, and 114d.

Parity is determined for all word lines quickly after self refresh entry before the refresh interval for memory cells 132 is reduced from a user controlled refresh interval (for example, 64 ms) to a higher self refresh interval (for example, 150 ms or higher). In one embodiment, DRAM 104 is refreshed and parity is calculated for the entire memory array 122 very quickly after the self refresh entry by performing multi-word line activations. Column select lines 140a-140f simultaneously control the bit switches (i.e. the connection of bit lines 130a-130d to LDQs 138a-138d) in sense amplifier banks 114a-114d. Therefore, the column select line burst acts on all the word lines selected in parallel and enables parallel calculation of the parity of the selected word lines since the parity generation and compare circuitry is not shared between column segments 170-170d. The impact on current usage is minimal since the current drops to the expected self refresh current very shortly (for example, 64 ms) after self refresh entry. The time it takes the current to drop to the expected self refresh current if multi-word line activations are not used is equal to the user retention time (for example, 64 ms).

During self refresh, column select lines 140a-140f are used to serially pass data bit values to parity circuit 116 through LDQs 138a-138d. The data bit values are serially passed to parity circuit 116 by performing a burst activation through all column select lines 140a-140f with a word line within each column segment 170a-170b activated. The burst activation through column select lines 140a-140f results in a string of data signals on LDQs 138a-138d indicating the data bit values stored in memory cells 132 along the activated word lines.

For example, to calculate parity simultaneously for multiple word lines, WL_1 128a through WL_4 128d are activated simultaneously. The data stored in the memory cells 132 at the cross points of WL_1 128a through WL_4 128d and bit lines 130a-130d are passed to sense amplifier banks 114a-114d, respectively. A column select line burst is performed by activating column select lines 140a-140f sequentially based on a clock signal. This generates serial data output stream on LDQ lines 138a-138d. The serial data stream for each column segment 170a-170d is passed to parity circuit 116. Parity circuit 116 determines the correct parity of the data upon entry to self refresh and then periodically determines the parity of the data during self refresh. The correct parity is compared to the current parity to check for errors.

The frequency of the column select line 140 burst can be relatively relaxed and still fit into the interval between two word line refreshes during self refresh. In one embodiment, the column select line burst is divided into subsections between LDQs within DRAM 104. In another embodiment, the column select line burst is used to refresh data along several word lines simultaneously with longer periods between refreshes.

After the initial parity determination upon self refresh entry, the frequency of parity generation and compare for checking for errors during self refresh is based on a tradeoff between the robustness of the ECC against errors versus the additional operating current of DRAM 104. In one embodiment, for minimal current usage, one word line per complete self refresh interval is selected for the parity evaluation. In this embodiment, it would take the number of word lines times the length of the self refresh interval to check the entire chip for errors. For example, for a 256M device with 8k word lines and a self refresh interval of 150 ms, it would take approximately 20 minutes to check the entire chip. In another embodiment, for maximum error detection, error checking is performed on every word line per self refresh interval. In this embodiment, it would take approximately 150 ms to check the entire chip, but the column select line current would contribute to the self refresh current. In one embodiment, to minimize the impact of the column select line activation current, several word lines that share a common column select line are refreshed and evaluated simultaneously as illustrated and described above. The overall power consumption of DRAM 104 is reduced, however, the self refresh current may show more pronounced peaks as multiple word lines are refreshed.

Figure 4:
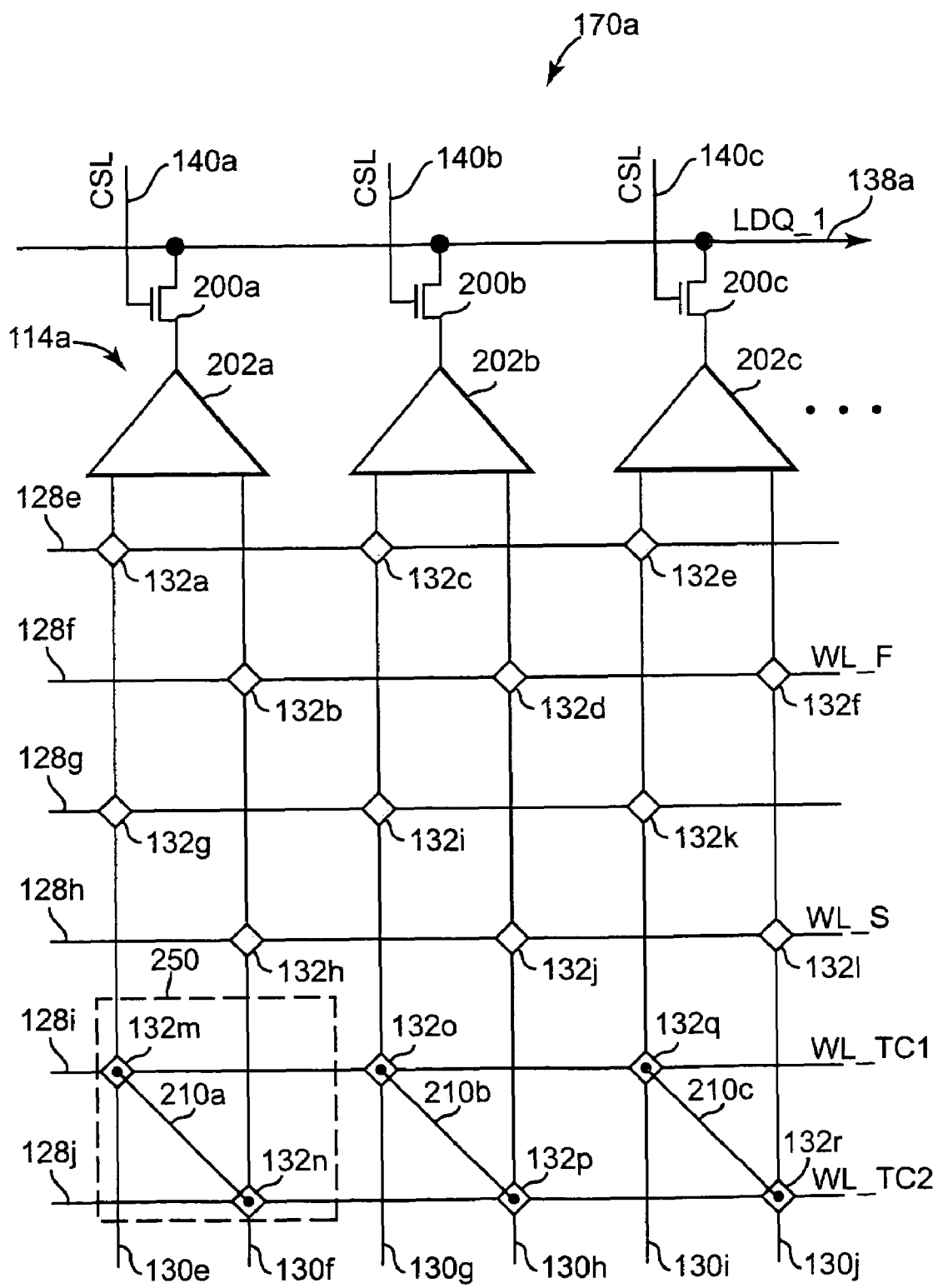
FIG. 4 is a diagram illustrating one embodiment of a portion of a column segment of a random access memory.

FIG. 4 is a diagram illustrating one embodiment of column segment 170a. Column segments 170b-170d, and other column segments in DRAM 104, are similar to column segment 170a. Column segment 170a includes sense amplifier bank 114a including bit switches 200a, 200b, and 200c and sense amplifiers 202a, 202b, and 202c. In one embodiment, bit switches 200a, 200b, and 200c are transistors. Column segment 170a includes word lines 128e-128j, bit lines 130e-130j, and memory cells 132a-132r. In one embodiment, word lines 128e, 128g, and 128i are true word lines, and word lines 128f, 128h, and 128j are complement word lines. In one embodiment, bit lines 130e, 130g, and 130i are true bit lines, and bit lines 130f, 130h, and 130j are complement bit lines.

The memory cells, such as memory cells 132a, 132c, 132e, etc. at each cross point of a true word line 128e, 128g, and 128i and a true bit line 130e, 130g, and 130i are true memory cells. The memory cells, such as memory cells 132b, 132d, 132f, etc. at each cross point of a complement word line 128f, 128h, and 128j and a complement bit line 130f, 130h, and 130j are complement memory cells. For a true memory cell, a logic high memory cell value sensed by the sense amplifier is output by the sense amplifier as a logic high data bit value. For a complement memory cell, a logic high memory cell value sensed by the sense amplifier is output by the sense amplifier as a logic low data bit value.

One side of sense amplifier 202a is electrically coupled to true bit line 130e and complement bit line 130f. The other side of sense amplifier 202a is electrically coupled to one side of the drain source path of transistor 200a. The other side of the drain source path of transistor 200a is electrically coupled to LDQ_1 138a. The gate of transistor 200a receives a column select line activation signal on CSL 140a. In response to a logic high column select line activation signal on CSL 140a, transistor 200a turns on to pass a sensed memory cell data bit value from sense amplifier 202a to LDQ_1 138a or pass a data bit value for writing to a memory cell from LDQ_1 138a to sense amplifier 202a. In response to a logic low column select line activation signal on CSL 140a, transistor 202a turns off to block the transfer of data between sense amplifier 202a and LDQ_1 138a.

One side of sense amplifier 202b is electrically coupled to true bit line 130g and complement bit line 130h. The other side of sense amplifier 202b is electrically coupled to one side of the drain source path of transistor 200b. The other side of the drain source path of transistor 200b is electrically coupled to LDQ_1 138a. The gate of transistor 200b receives a column select line activation signal on CSL 140b. In response to a logic high column select line activation signal on CSL 140b, transistor 200b turns on to pass a sensed memory cell data bit value from sense amplifier 202b to LDQ_1 138a or pass a data bit value for writing to a memory cell from LDQ_1 138a to sense amplifier 202b. In response to a logic low column select line activation signal on CSL 140b, transistor 202b turns off to block the transfer of data between sense amplifier 202b and LDQ_1 138a.

One side of sense amplifier 202c is electrically coupled to true bit line 130i and complement bit line 130j. The other side of sense amplifier 202c is electrically coupled to one side of the drain source path of transistor 200c. The other side of the drain source path of transistor 200c is electrically coupled to LDQ_1 138a. The gate of transistor 200c receives a column select line activation signal on CSL 140c. In response to a logic high column select line activation signal on CSL 140c, transistor 200c turns on to pass a sensed memory cell data bit value from sense amplifier 202c to LDQ_1 138a or pass a data bit value for writing to a memory cell from LDQ_1 138a to sense amplifier 202c. In response to a logic low column select line activation signal on CSL 140c, transistor 202c turns off to block the transfer of data between sense amplifier 202c and LDQ_1 138a.

In one embodiment, word line fail (WL_F) 128f represents a word line having a failed memory cell, such as memory cell 132b, 132d, or 132f. Word line spare (WL_S) 128h represents a spare word line in column segment 170a. WL_S 128h is used to replace a failed word line, such as WL_F 128f. WL_TC1 128i represents a first transfer cell word line and WL_TC2 128j represents a second transfer cell word line for column segment 170a. Memory cells 132m-132r along WL_TC1 128i and WL_TC2 128j are transfer memory cells for inverting data as described in further detail below with reference to FIG. 5. Memory cell 132m is electrically shorted to memory cell 132n through signal path 210a. Memory cell 132o is electrically shorted to memory cell 132p through signal path 210b. Memory cell 132q is electrically shorted to memory cell 132r through signal path 210c.

During self refresh, LDQ_1 138a passes serial data to parity circuit 116 in response to a column select line burst. For example, to provide the data bit values stored in memory cells 132b, 132d, and 132f along WL_F 128f, WL_F 128f is activated after equalization and precharge circuits equalize the voltage on bit lines 130e-130j connected to sense amplifiers 202a-202c. The data bit values stored in memory cells 132b, 132d, and 132f are passed to sense amplifiers 202a-202c, respectively. A column select line burst is performed by activating CSLs 140a-140c sequentially based on a clock signal to sequentially turn on transistors 200a-200c. The column select line burst generates serial data output on LDQ_1 138a including the data bit values stored in memory cells 132b, 132d, and 132f. The serial data is passed to parity circuit 116.

Figure 5:
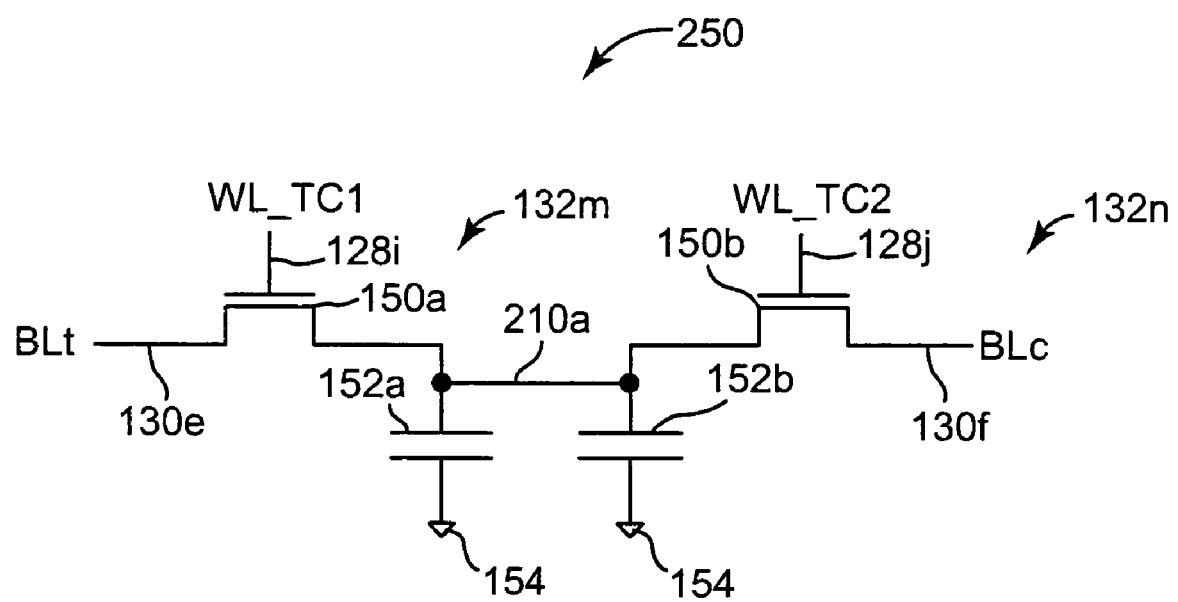
FIG. 5 is a diagram illustrating one embodiment of transfer memory cells.

FIG. 5 illustrates one embodiment of transfer cells 250. Transfers cells 250 include memory cell 132m and memory cell 132n. Memory cell 132m includes transistor 150a and capacitor 152a, and memory cell 132n includes transistor 150b and capacitor 152b. The gate of transistor 150a is electrically coupled to WL_TC1 128i. The drain source path of transistor 150a is electrically coupled between bit line 130e and one side of capacitor 152a. The other side of capacitor 152a is electrically coupled to reference signal 154, such as one-half the supply voltage or ground. The gate of transistor 150b is electrically coupled to WL_TC2 128j. The drain source path of transistor 150b is electrically coupled between bit line 130f and one side of capacitor 152b. The other side of capacitor 152b is electrically coupled to reference signal 154, such as one-half the supply voltage or ground. Capacitor 152a is electrically coupled to capacitor 152b through signal path 210a.

Capacitor 152a is charged and discharged to represent a logic "0" or a logic "1". During a read operation, WL_TC1 128i is activated to turn on transistor 150a and the value stored on capacitors 152a and 152b is read by sense amplifier 202a through true bit line 130e. During a write operation, WL_TC1 128i is activated to turn on transistor 150a and access capacitors 152a and 152b. Sense amplifier 202a connected to true bit line 130e is overdriven to write a data value on capacitors 152a and 152b through true bit line 130e and transistor 150a.

Capacitor 152b is charged and discharged to represent a logic "0" or a logic "1". During a read operation, WL_TC2 128j is activated to turn on transistor 150b and the value stored on capacitors 152a and 152b is read by sense amplifier 202a through complement bit line 130f. During a write operation, WL_TC2 128j is activated to turn on transistor 150b and access capacitors 152a and 152b. Sense amplifier 202a connected to complement bit line 130f is overdriven to write a data value on capacitors 152a and 152b through complement bit line 130e and transistor 150b.

Capacitors 152a and 152b store the same voltage level and are complementary memory cells coupled through true and complement bit lines 130e and 130f, respectively, to differential inputs of sense amplifier 202a. The logic level stored in memory cell 132m as sensed by sense amplifier 202a is the inverse of the logic level stored in memory cell 132n, and the logic level stored in memory cell 132n as sensed by sense amplifier 202a is the inverse of the logic level stored in memory cell 132m. By first activating WL_TC1 128i with WL_TC2 128j inactive and writing a logic level to memory cell 132m and then activating WL_TC2 128j with WL_TC1 128i inactive and reading the logic level of memory cell 132n, the logic level sensed by sense amplifier 202a of memory cell 132n is the inverse of the logic level written to memory cell 132m.

The transfer memory cells along WL_TC1 128i and WL_TC2 128j are used to simultaneously invert the data bit values stored in all memory cells along another word line in column segment 170a. For example, to invert the data bit values stored in memory cells 132b, 132d, and 132f coupled to WL_F 128f, equalization and precharge circuits equalize the voltage on bit lines 130e-130j connected to sense amplifiers 202a-202c. Next, WL_F 128f is activated and sense amplifiers 202a senses the data bit value bit stored in memory cell 132b, sense amplifier 202b senses the data bit value stored in memory cell 132d, and sense amplifier 202c senses the data bit value stored in memory cell 132f. With sense amplifiers 202a-202c still set, WL_F 128f is deactivated and WL_TC1 128i is activated to write the sensed data bit values to memory cells 132m, 132o, and 132q, which also writes the sensed data bit values to the capacitors of memory cells 132n, 132p, and 132r. Next, WL_TC1 128i is deactivated and the equalization and precharge circuits equalize the voltage on bit lines 130e-130j. Activating WL_TC2 results in sense amplifiers 202a-202c sensing the logical data bit values stored in memory cells 132n, 132p, and 132r, which are now the inverse of the logical data bit values stored in memory cells 132m, 132o, and 132q. The inverted data bit values can then be written to another word line by activating another word line, such as WL_S 128h, with sense amplifiers 202a-202c still set.

Figure 6:
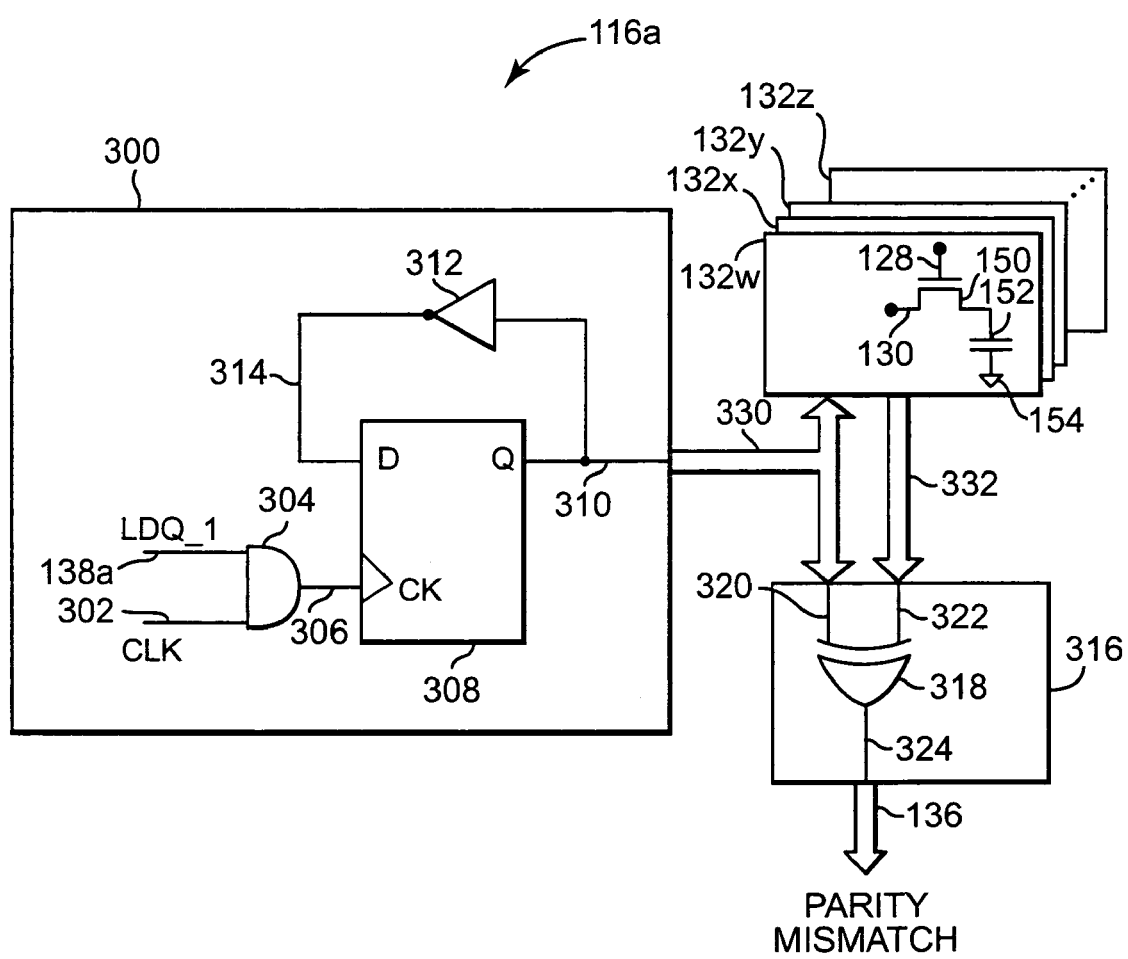
FIG. 6 is a block diagram illustrating one embodiment of a parity generation and parity compare circuit.

FIG. 6 is a block diagram illustrating one embodiment of a parity generation and parity compare circuit 116a. Parity generation and parity compare circuit 116a is configured for generating and comparing parity information for column segment 170a. There is one parity generation and parity compare circuit similar to parity generation and parity compare circuit 116a for each column segment in DRAM 104, such as column segments 170b-170d. Parity generation and parity compare circuit 116a includes parity generation circuit 300, parity compare circuit 316, and memory cells 132w-132z for storing parity information. Parity generation circuit 300 and parity compare circuit 316 are part of parity circuit 116, and memory cells 132w-132z are part of memory array 122. Parity generation circuit 300 passes parity information to memory cells 132w-132z and to parity compare circuit 316 through communication path 330. Parity compare circuit 316 receives stored parity information from memory cells 132w-132z through communication path 332. Parity compare circuit 316 compares parity data received from parity generation circuit 300 and memory cells 132w-132z to provide a parity mismatch signal on control communications path 136.

Parity generation circuit 300 includes AND gate 304, delay (D) type flip-flop 308, and inverter 312. A first input of AND gate 304 receives the LDQ signal on LDQ_1 138a, and a second input of AND gate 304 receives a clock (CLK) signal on CLK signal path 302. The output of AND gate 304 is electrically coupled to the clock (CK) input of flip-flop 308 through signal path 306. The data output (Q) of flip-flop 308 is electrically coupled to the input of inverter 312 through signal path 310. The output of inverter 312 is electrically coupled to the data input (D) of flip-flop 308 through signal path 314.

Flip-flop 308 is initialized to a logic low before each parity determination. AND gate 304 receives serial data streams (data bit values stored in memory cells along an activated word line) on LDQ_1 138a and a CLK signal, which clocks the column select line burst, on CLK signal path 302. In response to a logic high LDQ signal and a logic high CLK signal, AND gate 304 outputs a logic high signal on signal path 306. With a logic high signal on signal path 306, Flip-flop 308 passes the signal on signal path 314 to signal path 310. Inverter 312 inverts the signal on signal path 310 to provide the signal on signal path 314. Flip-flop 308 toggles each time a logic high data bit value is received in the serial data stream on LDQ_1 138a. After the entire serial data stream from the column select line burst for the selected word line 128 has been received by parity generation circuit 300, the output (Q) of flip-flop 308 provides on signal path 310 the parity of the data bit values. The parity data bit value for each word line in column segment 170a is stored in one memory cell of memory cells 132w-132z.

Each memory cell 132w-132z includes a transistor 150 and a capacitor 152. The gate of transistor 150 is electrically coupled to a word line 128. One side of the drain-source path of transistor 150 is electrically coupled to a bit line 130 and the other side of the drain-source path is electrically coupled to one side of capacitor 152. The other side of capacitor 152 is electrically coupled to a reference 154, such as one-half the supply voltage or ground. Capacitor 152 is charged and discharged to represent a logic "0" or a logic "1" for storing the parity of the data bit values stored in memory cells 132 along a selected word line 128.

Memory cells 132w-132z provide one storage location for each word line in column segment 170a for storing the parity information (e.g., 8k parity memory for a 256M chip). In one embodiment, memory cells 132w-132z are controlled by one additional column select line 140 (i.e., parity column select line) at the end of word lines 128 of column segment 170a. This parity column select line 140 is excluded from the column select line burst. The parity column select line is activated after completion of the column select line burst to write the parity information from parity generation circuit 300 into the appropriate parity memory cell 132w-132z.

Compare circuit 316 includes an exclusive OR (XOR) gate 318. A first input of XOR gate 318 receives a generated parity signal on signal path 320 from communication path 330, and a second input of XOR gate 318 receives a stored parity signal on signal path 322 from communication path 332. The output of XOR gate 318 provides a parity mismatch signal on parity mismatch signal path 324 to pass to control communications path 136. If the generated parity equals the stored parity, XOR gate 318 outputs a logic low signal on parity mismatch signal path 324 for the activated word line. If the generated parity does not match the stored parity, XOR gate 318 outputs a logic high signal on parity mismatch signal path 324 to indicate a parity mismatch for the activated word line. The parity mismatch signal for the activated word line is passed to control circuit 110 through control communications path 136 to initiate the error correction process.

Upon entry to self refresh, parity generation circuit 300 generates parity information for all word lines 128 (one at a time) in column segment 170a and stores the parity information in memory cells 132w-132z as the correct parity information. During self refresh, on a selected schedule, parity generation circuit 300 again generates the parity information for word lines 128 in column segment 170a. Parity compare circuit 316 compares the correct parity information stored in memory cells 132w-132z to the newly generated parity information from parity generation circuit 300. If the parity information stored in memory cells 132w-132z does not match the newly generated parity information from parity generation circuit 300, parity compare circuit 316 provides a parity mismatch signal to initiate the error correction process for the word line 128 having a failing memory cell. If the parity information stored in memory cells 132w-132z matches the newly generated parity information from parity generation circuit 300, the parity checking for words lines 128 in column segment 170a continues on the selected schedule until self refresh exit.

Since the parity information for specific word lines 128 is periodically generated during self refresh and compared to the initially determined parity information obtained right after self refresh entry, occasionally there is a mismatch between the generated parity information and the stored parity information indicating an error. The following description describes how an error is corrected without knowing the address of the failing memory cell along the activated word line. This method is effective for all "stuck at" single cells (e.g., retention fails).

Figure 7:
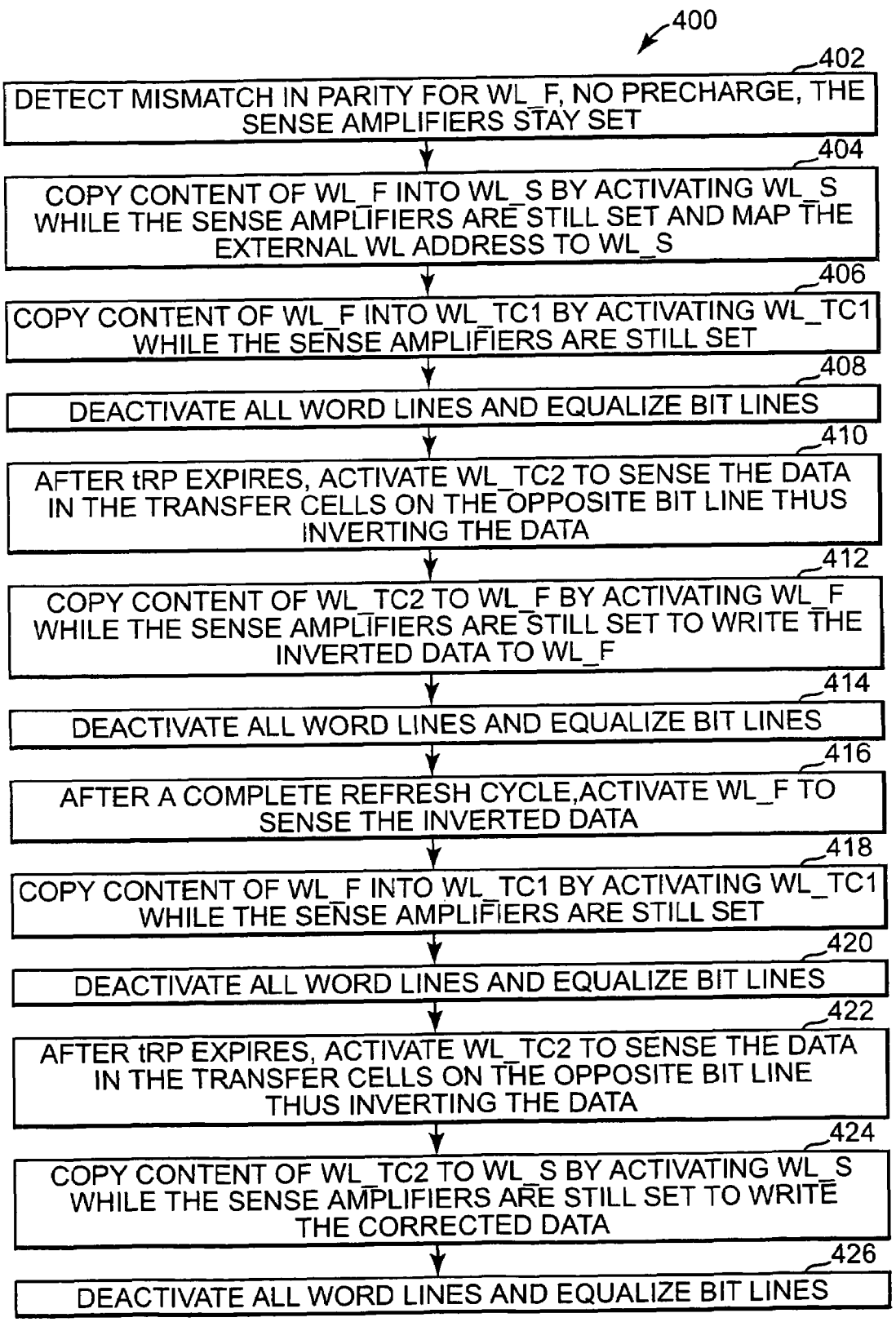
FIG. 7 is a flow diagram illustrating one embodiment of a method for correcting detected errors in a random access memory.

FIG. 7 is a flow diagram illustrating one embodiment of a method 400 for correcting errors detected by parity circuit 116a in column segment 170a. A similar process applies to all column segments in DRAM 104. Method 400 can detect and repair retention fails, which is the dominant fail mechanism for low powered DRAMS during self refresh. At 402, for example, a parity mismatch is detected by parity circuit 116a for WL_F 128f. The equalization and precharge circuits do not equalize the voltage on bit lines 130e-130j such that sense amplifiers 202a-202c stay set with the data bit values stored in memory cells 132b, 132d, and 132f along WL_F 128f. At 404, the data bit values stored in memory cells 132b, 132d, and 132f along WL_F 128f are written to memory cells 132h, 132j, and 132l along WL_S 128h by activating WL_S 128h while sense amplifiers 202a-202c are still set. At the same time, the address for WL_F 128f is externally mapped to WL_S 128h. If self refresh exits before the completion of the error correction procedure, WL_S 128h is used in place of WL_F 128f.

At 406, the data bit values stored memory cells 132b, 132d, and 132f are written to memory cells 132m, 132o, and 132q along WL_TC1 128i by activating WL_TC1 128i while sense amplifiers 202a-202c are still set. The data written to memory cells 132m, 132o, and 132q is also transferred to memory cells 132n, 132p, and 132r. At 408, all the word lines are deactivated and the equalization and precharge circuits equalize the voltage on bit lines 130e-130j. At 410, after the precharge time (tRP) expires, WL_TC2 128j is activated to enable sense amplifiers 202a-202c to sense the logical data bit values stored in transfer memory cells 132n, 132p, and 132r along bit lines 130f, 130h, and 130j thus inverting the logical data bit values. At 412, the data bit values stored in memory cells 132n, 132p, and 132r along WL_TC2 128j are written to memory cells 132b, 132d, and 132f along WL_F 128f by activating WL_F 128f while sense amplifiers 202a-202c are still set. At 414, all the word lines are deactivated and the equalization and precharge circuits equalize the voltage on bit lines 130e-130j. In one embodiment, blocks 402 through 414 are performed in approximately two times the activate and deactivate time (tRC) for a word line or approximately 150 ns. Therefore, the operations do not disrupt the normal refresh cycle, which is typically about 20 μs between word line activations in self refresh.

At 416, after a complete refresh cycle, WL_F 128f is activated to sense the inverted data bit values stored in memory cells 132b, 132d, and 132f. The fail should reoccur along WL_F 128f. Therefore, the sensed data bit values should be the inverse of the correct data bit values including the failing memory cell. At 416, after a complete refresh cycle, WL_F 128f is activated to sense the inverted data bit values stored in memory cells 132b, 132d, and 132f. At 418, the data bit values stored in memory cells 132b, 132d, and 132f along WL_F 128f are written to memory cells 132m, 132o, and 132p along WL_TC1 128i by activating WL_TC1 128i while sense amplifiers 202a-202c are still set.

At 420, all the word lines are deactivated and the equalization and precharge circuits equalize the voltage on bit lines 130e-130j. At 422, after tRP expires, WL_TC2 128j is activated to sense the logical data bit values stored in transfer memory cells 132n, 132p, and 132r along bit lines 130f, 130h, and 130j thus inverting the data. At 424, the logical data bit values stored in memory cells 132n, 132p, and 132r along WL_TC2 128j are written to memory cells 132h, 132j, and 132l along WL_S 128h by activating WL_S 128h while sense amplifiers 202a-202c are still set. At 426, all the word lines are deactivated and the equalization and precharge circuits equalize the voltage on bit lines 130e-130j to prepare for the next read or write operation. Memory cells 132h, 132j, and 132l along WL_S 128h now store the corrected data bit values from memory cells 132b, 132d, and 132f along WL_F 128f. WL_S 128h is then used in place of WL_F 128f upon self refresh exit.

Method 400 does not affect the timing of the self refresh. In particular, method 400 does not affect the exit timing of the self refresh. In addition, method 400 is based on the true and complement bit line split in the sense amplifiers. Therefore, method 400 is completely independent of any bit line twist scheme. Method 400 also does not change based on whether WL_F 128f, WL_S 128h, WL_TC1 128i, and WL_TC2 128j are true, complement, or mixed word lines. Method 400 results in the external access to WL_F 128f being remapped to WL_S 128h, which now contains all correct data. In one embodiment, each column segment 170 has one spare word line dedicated to error correction. Therefore, one error correction in a specific column segment 170 uses the spare word line and the error detection and correction in the specific column segment 170 is discontinued. In another embodiment, any error correction in memory array 122 discontinues the error detection and correction in DRAM 104.

In one embodiment, permanent repair of the faulty memory element is performed. The correction of the error and remapping of the external word line address to the spare word line can be made permanent, even if the power is completely removed from DRAM 104. In one embodiment, as DRAM 104 operates in self refresh (either for testing or during consumer use) DRAM 104 essentially tests and repairs itself. To permanently repair a faulty memory cell, the remapping information is stored in a set of fuses, such as electrically activated fuses, which retain the information if the power is removed. The actual fusing could be performed when a self refresh exit request from the user is detected. The details of the fusing operation depend on the design of the fuses.

Embodiments of the present invention provide a method for error detection and correction by rapid generation of parity information for entire word lines during self refresh. The error correction is based on the inversion of data along faulty word lines and for the instant inversion for all data along a word line. The operations are non-disruptive to the normal operation of the DRAM; in particular, they do not negatively affect the self refresh exit timing. The overhead of the present invention is minimal. Embodiments of the invention use one parity register per word line, one spare word line, and two transfer word lines per sense amplifier segment.

What is claimed is:

1. A memory comprising:
    a sense amplifier segment;
    a plurality of word lines including a spare word line, a first transfer word line, and a second transfer word line complementary to the first transfer word line;
    a plurality of bit lines coupled to the sense amplifier segment; and
    a memory cell located at each cross point of each word line and each bit line,
    wherein the first transfer word line and the second transfer word line are adapted for simultaneously inverting data bit values stored in memory cells along a failed word line to correct a parity error during self refresh.

2. The memory of claim 1, wherein the spare word line is adapted to replace a failed word line during self refresh due to a parity error.

3. The memory of claim 1, wherein the first transfer word line and the second transfer word line are adapted to correct parity errors without knowing a location of a failed memory cell along the failed word line.

4. The memory of claim 1, wherein the plurality of word lines comprises true word lines and complement word lines.

5. The memory of claim 1, wherein the plurality of bit lines comprises true bit lines and complement bit lines.

6. A memory comprising:
    a sense amplifier segment;
    a plurality of word lines including a spare word line, a first transfer word line, and a second transfer word line;
    a plurality of bit lines coupled to the sense amplifier segment; and
    a memory cell located at each cross point of each word line and each bit line,
    wherein a memory cell located along the first transfer word line coupled to a first sense amplifier is electrically shorted to a memory cell located along the second transfer word line coupled to the sense amplifier for inverting data bit values stored in memory cells along a failed word line to correct a parity error during self refresh.

7. The memory of claim 6, wherein the spare word line is adapted to replace a failed word line during self refresh due to a parity error.

8. The memory of claim 6, wherein the first transfer word line and the second transfer word line are adapted to correct parity errors without knowing a location of a failed memory cell along the failed word line.

9. The memory of claim 6, wherein the plurality of word lines comprises true word lines and complement word lines.

10. The memory of claim 6, wherein the plurality of bit lines comprises true bit lines and complement bit lines.

11. A dynamic random access memory comprising:
    a sense amplifier bank including a plurality of sense amplifiers;
    a true bit line coupled to a first input of each sense amplifier;
    a complement bit line coupled to a second input of each sense amplifier;
    a plurality of word lines including a spare word line for replacing a failed word line due to a parity error detected during self refresh, and a first transfer word line and a second transfer word line; and
    a plurality of memory cells, each memory cell located at a cross point of each word line and each true bit line and complement bit line,
    wherein the memory cell located along the first transfer word line at the cross point of each true bit line is electrically shorted to the memory cell located along the second transfer word line at the cross point of each complement bit line for each sense amplifier, and
    wherein the first transfer word line and the second transfer word line are adapted for simultaneously inverting data bit values stored in memory cells along a failed word line for correcting for a parity error detected during self refresh.

12. The memory of claim 11, wherein the first transfer word line and the second transfer word line are adapted to correct parity errors without knowing a location of a failed memory cell along the failed word line.

13. A memory comprising:
   means for replacing a failed word line with a spare word line during self refresh due to a parity error detected during self refresh without affecting self refresh timing; and
   means for simultaneously inverting data bit values stored in memory cells along the failed word line to correct for the parity error during self refresh.

14. The memory of claim 13, further comprising:
   means for mapping an address of the failed word line to the spare word line.

15. A memory comprising:
   a sense amplifier segment;
   a plurality of word lines including a spare word line, a first transfer word line, and a second transfer word line complementary to the first transfer word line;
   a plurality of bit lines coupled to the sense amplifier segment; and
   a memory cell located at each cross point of each wordline and each bit line,
   wherein a memory cell along the first transfer word line is electrically shorted to a memory cell along the second transfer word line, and
   wherein the first transfer word line and the second transfer word line are adapted for simultaneously inverting data bit values stored in memory cells along a failed word line to correct a parity error during self refresh.

16. The memory of claim 15, wherein the spare word line is adapted to replace a failed word line during self refresh due to a parity error.

17. The memory of claim 15, wherein the first transfer word line and the second transfer word line are adapted to correct parity errors without knowing a location of a failed memory cell along the failed word line.

18. The memory of claim 15, wherein the plurality of word lines comprises true word lines and complement word lines.

19. The memory of claim 15, wherein the plurality of bit lines comprises true bit lines and complement bit lines.

20. A memory comprising:
   means for replacing a failed word line with a spare word line during self refresh due to a parity error detected during self refresh without affecting self refresh timing; and
   means for simultaneously inverting data bit values stored in memory cells along the failed word line to correct for the parity error during self refresh,
   wherein the means for simultaneously inverting data bit values stored in memory cells along the failed word line comprises a memory cell along a first transfer word line electrically shorted to a memory cell along a second transfer word line.

21. The memory of claim 20, further comprising:
   means for mapping an address of the failed word line to the spare word line.

* * * * *